United States Patent
Tseng et al.

(10) Patent No.: US 7,302,246 B2
(45) Date of Patent: Nov. 27, 2007

(54) PROGRAMMABLE GAIN AMPLIFIER WITH SELF-ADJUSTING OFFSET CORRECTION

(75) Inventors: James Tseng, Tempe, AZ (US); Waleed Khalil, Tempe, AZ (US); Bobby Nikjou, Tempe, AZ (US); Luke A. Johnson, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 601 days.

(21) Appl. No.: 10/329,187

(22) Filed: Dec. 23, 2002

(65) Prior Publication Data

US 2004/0121735 A1    Jun. 24, 2004

(51) Int. Cl.
*H04B 1/06* (2006.01)

(52) U.S. Cl. ............... 455/252.2; 455/248.1; 330/200

(58) Field of Classification Search ............. 455/114.3, 455/114.2, 125, 127, 75, 127.1–127.3, 248.1, 455/232.1; 330/200
See application file for complete search history.

(56) References Cited

U.S. PATENT DOCUMENTS

| 5,233,309 | A  | * | 8/1993  | Spitalny et al. ............... 330/84 |
| 5,812,023 | A  | * | 9/1998  | Jones ............................ 330/9 |
| 6,320,898 | B1 | * | 11/2001 | Newson et al. ............. 375/144 |
| 6,400,308 | B1 | * | 6/2002  | Bell et al. ..................... 342/71 |
| 6,563,445 | B1 | * | 5/2003  | Sabouri ....................... 341/120 |
| 2002/0094792 | A1 | * | 7/2002 | Oono et al. ................. 455/118 |

FOREIGN PATENT DOCUMENTS

JP          354097727 A    *    8/1979

* cited by examiner

*Primary Examiner*—Matthew Anderson
*Assistant Examiner*—Angelica M. Perez
(74) *Attorney, Agent, or Firm*—Schwegman, Lundberg & Woessner, P.A.

(57) ABSTRACT

Briefly, in accordance with one embodiment of the invention, a calibration circuit may detect a difference between first and second outputs of a differential output programmable gain amplifier to determine a dc offset at the differential output. In the event an offset is detected, a differential gain of the programmable gain amplifier may be adjusted until the offset is adjusted, or eliminated, to an acceptable predetermined value.

27 Claims, 3 Drawing Sheets

PROGRAMMABLE GAIN AMPLIFIER WITH SELF-ADJUSTING OFFSET CORRECTION

DESCRIPTION OF THE DRAWING FIGURES

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
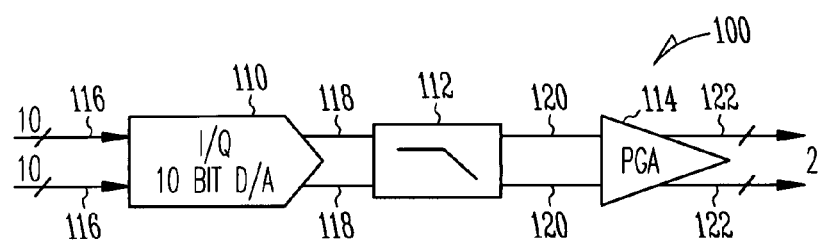
FIG. 1 is a block diagram of a transmission path in an analog front end baseband circuit in accordance with one embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

The processes and displays presented herein are not inherently related to any particular computing device or other apparatus. Various general-purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

It should be understood that embodiments of the present invention may be used in a variety of applications. Although the present invention is not limited in this respect, the circuits disclosed herein may be used in many apparatuses such as in the transmitters and receivers of a radio system. Radio systems intended to be included within the scope of the present invention include, by way of example only, cellular radiotelephone communication systems, satellite communication systems, two-way radio communication systems, one-way pagers, two-way pagers, personal communication systems (PCS), personal digital assistants (PDA's) and the like.

Types of cellular radiotelephone communication systems intended to be within the scope of the present invention include, although not limited to, Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, and the like.

Referring now to FIG. 1, a block diagram of a transmission path in an analog front end baseband circuit in accordance with one embodiment of the present invention will be discussed. Transmission path 100 may be included in a baseband processor of a wireless transceiver. Digital in-phase (I) and quadrature (Q) data may be provided to a digital-to-analog (D/A) converter 110 prior to being transmitting as a radio-frequency (RF) signal through an antenna via transmission path 100. D/A converter 110 may be utilized to convert a digitally modulated signal into an analog signal.

In one embodiment of the invention, the digitally modulated signal may be a 10-bit signal provided to the inputs of D/A converter 110, although the scope of the invention is not limited in this respect. The output 118 of D/A converter 110 is an amplitude based signal that may be processed through a reconstruction filter 112 to result in a smooth analog signal. In one embodiment of the invention, reconstruction filter 112 may have a roll-off characteristic and cutoff frequency in accordance with a given standard for which transmission path may be intended, for example, a wideband code division multiple access (CDMA) standard, so that frequency mask requirements may be met, although the scope of the invention is not limited in this respect. In one particular embodiment of the invention, reconstruction filter may be a $5^{th}$ order brick wall filter, although the scope of the invention is not limited in this respect.

The analog output 120 of reconstruction filter 112 may be provided to a programmable gain amplifier (PGA) 114 to amplify the analog signal prior to transmission. The programmability of PGA 114 may provide flexibility for transmission path 100 to be reconfigurable according to a desired application, and to operate with a wide range of RF chipsets and circuits to which the output 122 of PGA 114 may be provided by allowing the gain and the output common mode voltage of the transmitted signal to be set as needed, although the scope of the invention is not limited in this respect.

In one emobidment of the invention, the performance of transmission path may be impacted by any offset error that may be encountered in the analog path. For example, in one embodiment, transmission path 100 may be utilized in a WCDMA transceiver using an in-phase (I) path, and a quadrature (Q) path. In such an arrangement, information may coded in the phase of the vector represented by the two orthogonal signals I and Q. In the event there is an offset in the zero crossing point of either channel, the offset indicates that the two vectors are not orthogonal. Besides causing an error in the phase-encoded data, this may result in spurious emissions in the RF modulator, which may depend on the quadrature nature of the signals for proper mixing. In accordance with the present invention, such offset may be detected and corrected by calibrating the output 122 of PGA 114 as shown in FIG. 2

Figure 2:
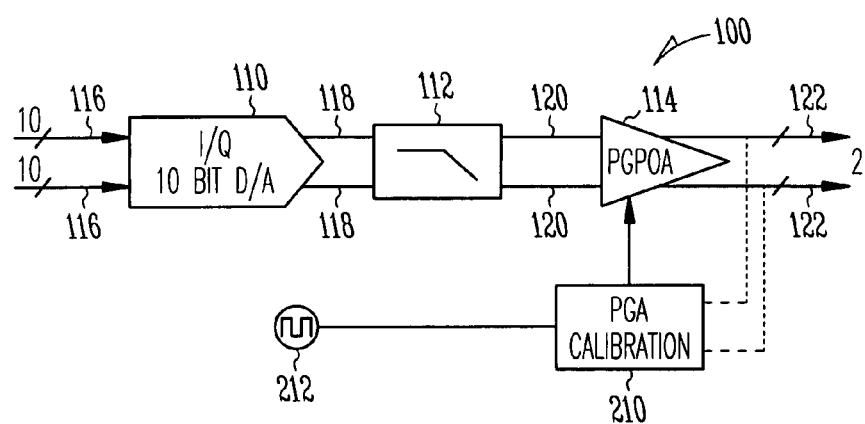
FIG. 2 is a block diagram of a transmission path as show in FIG. 1 that includes a calibration block to correct a voltage offset the transmission path in accordance with one embodiment of the present invention.

Referring now to FIG. 2, a block diagram of a transmission path as show in FIG. 1 that includes a calibration block to correct a voltage offset the transmission path in accordance with one embodiment of the present invention will be discussed. A PGA calibration block 210 may sample the gain of programmable gain amplifier 114 at output 122 and correct any detected offset, thereby making programmable gain amplifier 114 be a programmable gain, programmable offset amplifier (PGPOA). The timing of the gain samples may be controlled with a calibration clock 212. Thus, in one embodiment of the invention, the offset at the output may be sampled by calibration block 210. In the event any offset is detected, the differential gain of PGA 114 may be adjusted to reduce or remove the offset, although the scope of the invention is not limited in this respect.

Figure 3:
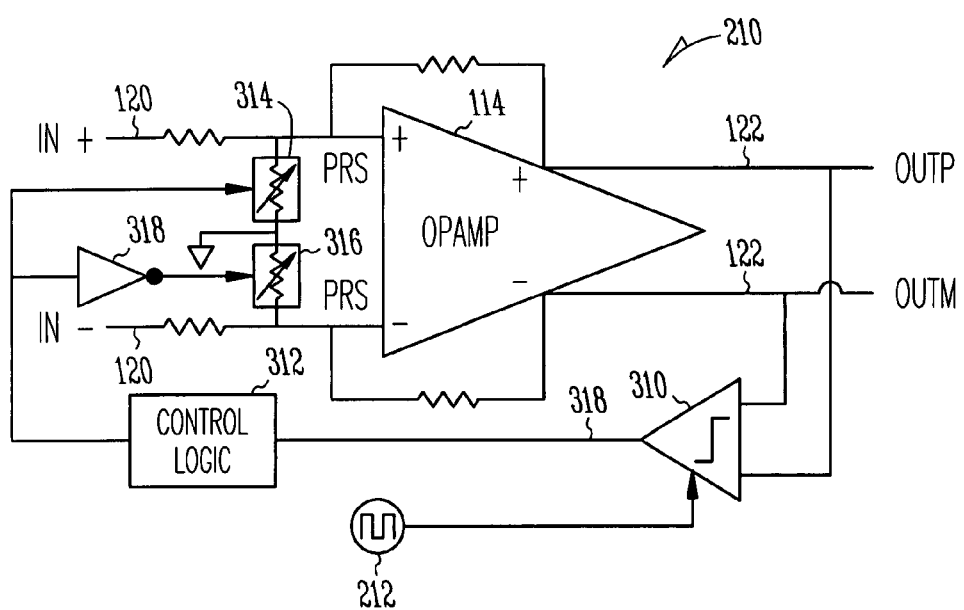
FIG. 3 is a block diagram of calibration block of a transmission path as shown in FIG. 2 in accordance with one embodiment of the present invention.

Referring now to FIG. 3, a block diagram of calibration block for a transmission path as shown in FIG. 2 in accordance with one embodiment of the present invention will be disussed. In one embodiment of the invention, calibration block 210 may include an offset-cancelled comparator 310 to sample the output 122 of PGA 114, which may comprise an operational amplifier as shown. D/A converter 110 may receive the code for half-scale (i.e., zero offset), so that comparator may provides a digital signal indicating if the output 122 of PGA 114 is positive where outp is greater than outm, or negative where outm is greater then outp. The output 318 of comparator 310 may be used to provide feedback to a control logic block 312, which may perform a binary search process to determine an offset value that sets the difference in the outputs 122, for example outp minus outm, close to zero. In one embodiment of the invention, an offset correction may be stored by control logic 312 in the form of a digital word that may be utilized to control the impedance of programmable trim resistors 314 and 316 which may be coupled at the input 120 of PGA 114 connected in an arrangement to provide adjustment to the offset at ouput 122. In one embodiment, the signal provided to the trim resistor 316 at the inverting input of PGA 114 may be inverted by inverter 318 to make an adjustment in the desired direction, although the scope of the invention is not limited in this respect.

The calibration control provided by calibration block 210 need not be limited to a binary search; other techniques may be ultilzed including using an up/down counter, multi-bit feedback, and so on, to provide an equivlanet result as provided by calibration block as desired, for example to improve the speed offset reduction, to reduce power consumed by calibration block, to increase the accuracy of the offset reduction, and so on, although the scope of the invention is not limited in this respect. It should be noted that the offset reduction provided by calibration block 210 in accordance with the present invention may be implemented without detriment to the programmability of the gain of PGA 114, and without reducing the dynamic range of the transmitted signal, although the scope of the invention is not limited in this respect.

Figure 4:
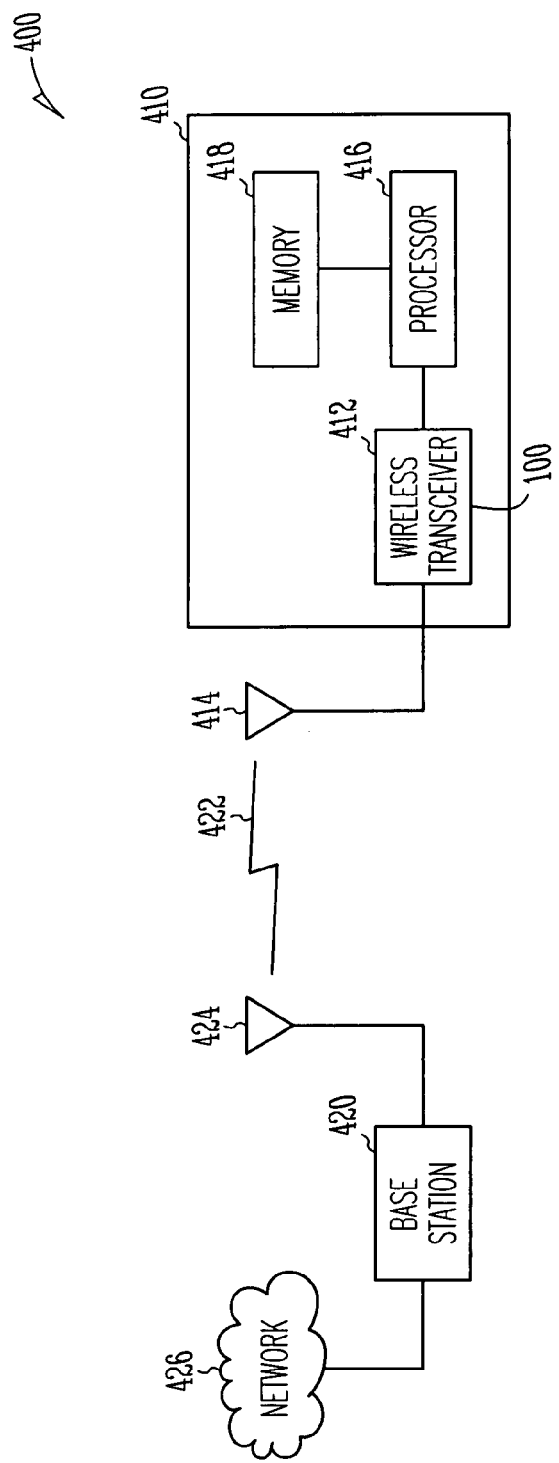
FIG. 4 is a block diagram of a wireless communication system in accordance with an embodiment of the present invention.

Referring now to FIG. 4, a wireless communication system in accordance with one embodiment of the present invention will be discussed. In the communication system 400 shown in FIG. 4, a wireless terminal 410 may include a wireless transceiver 412 to couple to an antenna 414 and to a processor 416. Processor 416 in one embodiment may comprise a single processor, or alternatively may comprise a baseband processor and an applications processor, and in an alternative embodiment the baseband processor may be disposed within wireless transceiver 412, although the scope of the invention is not limited in this respect. Processor 416 may couple to a memory 418 which may include volatile memory such as DRAM, non-volatile memory such as flash memory, or alternatively may include other types of storage such as a hard disk drive, although the scope of the invention is not limited in this respect. Some portion or all of memory 418 may be included on the same integrated circuit as processor 416, or alternatively some portion or all of memory 418 may be disposed on an integrated circuit or other medium, for example a hard disk drive, that is external to the integrated circuit of processor 416, although the scope of the invention is not limited in this respect.

Wireless terminal 410 may communicate with base station 420 via wireless communication link 422, where base station 420 may include at least one antenna 424. Base station 420 may couple with network 426 so that wireless terminal 410 may communicate with network 426, including devices coupled to network 426, by communicating with base station 420 via wireless communication link 422. Network 426 may include a public network such as a telephone network or the Internet, or alternatively network 426 may include a private network such as an intranet, or a combination of a public and a private network, although the scope of the invention is not limited in this respect. Communication between wireless terminal 410 and base station 420 may be implemented via a wireless local area network (WLAN), for example a network compliant with a an Institute of Electrical and Electronics Engineers (IEEE) standard such as IEEE 802.11a, IEEE 802.11b, and so on, although the scope of the invention is not limited in this respect. In another embodiment, communication between wireless terminal and base station 420 may be implemented via a cellular communication network compliant with a 3GPP standard, although the scope of the invention is not limited in this respect. In one embodiment of the invention, transmission path 100 may be included within a baseband processor of wireless transceiver 412 and may support one or more wireless standards such as a single mode WCDMA or a dual mode GPRS and UMTS standard, although the scope of the invention is not limited in this respect.

Although the invention has been described with a certain degree of particularity, it should be recognized that elements thereof may be altered by persons skilled in the art without departing from the spirit and scope of the invention. It is believed that the programmable gain amplifier with self-adjusting offset correction or the like of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof, and further without providing substantial change thereto. It is the intention of the claims to encompass and include such changes.

What is claimed is:

1. An apparatus, comprising: a programmable gain amplifier, said programmable gain amplifier having a differential output; and a calibration block to detect an offset at the differential and to adjust the detected offset by adjusting a differential gain of the differential output wherein: said programmable gain amplifier is an operational amplifier having a differential input and the differential output; and said calibration block includes: an offset-cancelled comparator coupled to the differential output to sample an output of the operational amplifier and to generate a digital signal indicating the output of the operational amplifier; a control logic block coupled to receive the digital signal from the comparator and to generate an offset value to set a difference of the differential output of the operational amplifier; and programmable trim resistors coupled to the differential input of the operational amplifier and coupled to the control logic block to receive a control signal to control an impedance of the programmable trim resistors to adjust the differential gain of the differential output.

2. An apparatus as claimed in claim 1, wherein said calibration block includes a comparator to detect the offset.

3. An apparatus as claimed in claim 1, wherein said calibration block is adapted to adjust the offset by adjusting a trim resistor at an input of said programmable gain amplifier.

4. An apparatus as claimed in claim 1, wherein said calibration block includes a switched current source at an input to said programmable gain amplifier to adjust a differential gain of said programmable gain amplifier to adjust the offset.

5. An apparatus as claimed in claim 1, wherein said calibration block includes a binary searcher to adjust the offset.

6. An apparatus as claimed in claim 1, wherein said calibration block includes an up/down counter to adjust the offset.

7. An apparatus as claimed in claim 1, wherein said calibration block includes a multi-bit analog to digital converter to adjust the offset.

8. An apparatus as claimed in claim 1, wherein said calibration block is adapted to detect and adjust the offset in response to a power on event.

9. An apparatus as claimed in claim 1, wherein said calibration block is adapted to detect and adjust the offset in response to a request from a processor.

10. An apparatus as claimed in claim 1, wherein a digital-to-analog converter is set to about midrange of full scale code upon at least one of a power on event or a calibration sequence.

11. An apparatus, comprising: a wireless transceiver; a microstrip antenna coupled to said wireless transceiver; a programmable gain amplifier coupled to said wireless transceiver, said programmable gain amplifier having a differential output; and a calibration block to detect an offset at the differential output and to adjust the detected offset by adjusting a differential gain of the differential output wherein: said programmable gain amplifier is an operational amplifier having a differential input and the differential output; and said calibration block includes: an offset-cancelled comparator coupled to the differential output to sample an output of the operational amplifier and to generate a digital signal indicating the output of the operational amplifier; a control logic block coupled to receive the digital signal from the comparator and to generate an offset value to set a difference of the differential output of the operational amplifier: and programmable trim resistors coupled to the differential input of the operational amplifier and coupled to the control logic block to receive a control signal to control an impedance of the programmable trim resistors to adjust the differential gain of the differential output.

12. An apparatus as claimed in claim 11, wherein said calibration block includes a comparator to detect the offset.

13. An apparatus as claimed in claim 11, wherein said calibration block is adapted to adjust the offset by adjusting a trim resistor at an input of said programmable gain amplifier.

14. An apparatus as claimed in claim 11, wherein said calibration block includes a switched current source at an input to said programmable gain amplifier to adjust a differential gain of said programmable gain amplifier to adjust the offset.

15. An apparatus as claimed in claim 11, wherein said calibration block includes a binary searcher to adjust the offset.

16. An apparatus as claimed in claim 11, wherein said calibration block includes an up/down counter to adjust the offset.

17. An apparatus as claimed in claim 11, wherein said calibration block includes a multi-bit analog to digital converter to adjust the offset.

18. An apparatus as claimed in claim 11, wherein said calibration block is adapted to detect and adjust the offset in response to a power on event.

19. An apparatus as claimed in claim 11, wherein said calibration block is adapted to detect and adjust the offset in response to a request from a processor.

20. An apparatus as claimed in claim 11, wherein a digital-to-analog converter is set to about midrange of full scale code upon at least one of a power on event or a calibration sequence.

21. A method, comprising: detecting an offset at a differential output of a programmable gain amplifier; and changing a differential gain of the programmable gain amplifier so that the offset is adjusted wherein: detecting an offset at a differential output includes detecting an offset at a differential output of an operational amplifier; and changing a differential gain of the programmable gain amplifier includes: sampling an output of the operational amplifier with an offset-cancelled comparator coupled to the differential output of the operational amplifier to generate a digital signal indicating the output of the operational amplifier; generating an offset value in a control logic block coupled to receive the digital signal from the comparator to set a difference of the differential output of the operational amplifier; and controlling an impedance of programmable trim resistors coupled to the differential input of the operational amplifier with a control signal from the control logic block to adjust a differential gain of the differential output.

22. A method as claimed in claim 21, wherein said detecting includes periodically sampling the differential output to determine the offset.

23. A method as claimed in claim 21, comparing a difference between a first output and a second output at the differential output, and, in the event the difference exceeds a predetermined value, adjusting a differential gain of the programmable gain amplifier until the difference does not exceed the predetermined value.

24. A method as claimed in claim 21, wherein said changing includes adjusting an impedance at an input of the programmable gain amplifier.

25. A method as claimed in claim 21, said detecting and said changing being executed in response to a power on event.

26. A method as claimed in claim 21, said detecting and said changing being executed in response to a request from a processor.

27. A method as claimed in claim 21, further including setting a digital-to-analog converter to about midrange of full scale code upon at least one of a power on event or a calibration sequence.

* * * * *

UNITED STATES PATENT AND TRADEMARK OFFICE
CERTIFICATE OF CORRECTION

| | | |
|---|---|---|
| PATENT NO. | : 7,302,246 B2 | Page 1 of 1 |
| APPLICATION NO. | : 10/329187 | |
| DATED | : November 27, 2007 | |
| INVENTOR(S) | : Tseng et al. | |

It is certified that error appears in the above-identified patent and that said Letters Patent is hereby corrected as shown below:

In column 5, line 9, in Claim 1, after "differential" insert -- output --.

In column 6, line 5, in Claim 11, after "amplifier" delete ":" and insert -- ; --, therefor.

Signed and Sealed this

Twenty-seventh Day of May, 2008

JON W. DUDAS
*Director of the United States Patent and Trademark Office*